US010090473B2

(12) United States Patent
Kim et al.

(10) Patent No.: US 10,090,473 B2
(45) Date of Patent: Oct. 2, 2018

(54) SUBSTRATE FOR ORGANIC ELECTRONIC DEVICE

(71) Applicant: LG Display Co., Ltd., Seoul (KR)

(72) Inventors: Ji Hee Kim, Daejeon (KR); Jung Hyoung Lee, Daejeon (KR); Sang Jun Park, Daejeon (KR); Yong Nam Kim, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/908,065

(22) PCT Filed: Sep. 30, 2014

(86) PCT No.: PCT/KR2014/009224
§ 371 (c)(1),
(2) Date: Jan. 27, 2016

(87) PCT Pub. No.: WO2015/047041
PCT Pub. Date: Apr. 2, 2015

(65) Prior Publication Data
US 2016/0172591 A1 Jun. 16, 2016

(30) Foreign Application Priority Data

Sep. 30, 2013 (KR) .................. 10-2013-0116194
Sep. 30, 2014 (KR) .................. 10-2014-0131921

(51) Int. Cl.
| H01L 51/00 | (2006.01) |
| C08L 79/08 | (2006.01) |
| C08K 3/22  | (2006.01) |
| C08G 73/12 | (2006.01) |
| H01L 51/52 | (2006.01) |

(52) U.S. Cl.
CPC .......... *H01L 51/004* (2013.01); *C08G 73/128* (2013.01); *C08K 3/22* (2013.01); *C08L 79/08* (2013.01); *H01L 51/0096* (2013.01); *H01L 51/0097* (2013.01); *H01L 51/5268* (2013.01); *H01L 51/5275* (2013.01); *C08K 2003/2241* (2013.01); *C08L 2203/20* (2013.01); *H01L 51/5253* (2013.01); *H01L 51/5256* (2013.01); *H01L 51/5262* (2013.01); *H01L 2251/5338* (2013.01); *H01L 2251/558* (2013.01); *Y02E 10/549* (2013.01)

(58) Field of Classification Search
None
See application file for complete search history.

(56) References Cited

U.S. PATENT DOCUMENTS

| 4,778,872 | A | * | 10/1988 | Sasaki | C08G 73/1007 525/436 |
| 5,166,308 | A | * | 11/1992 | Kreuz | C08G 73/1042 528/125 |
| 5,998,013 | A | * | 12/1999 | Shoshi | C08J 7/047 106/287.34 |
| 7,550,194 | B2 | * | 6/2009 | Simone | B32B 27/00 428/220 |
| 8,846,852 | B2 | * | 9/2014 | Jeong | C08G 73/1039 428/1.26 |
| 9,073,287 | B2 | * | 7/2015 | Wei | C08J 7/04 |
| 2003/0104232 | A1 | * | 6/2003 | Kihara | C08G 73/10 428/473.5 |
| 2004/0265731 | A1 | * | 12/2004 | Okada | B32B 15/08 430/270.1 |
| 2007/0066739 | A1 | * | 3/2007 | Odle | C08J 7/047 524/430 |
| 2007/0093640 | A1 | * | 4/2007 | Kim | C08G 69/26 528/332 |
| 2008/0138537 | A1 | * | 6/2008 | Simone | B32B 27/00 428/1.1 |
| 2008/0176167 | A1 | * | 7/2008 | Kawamori | C09J 179/08 430/271.1 |
| 2008/0182101 | A1 | * | 7/2008 | Carcia | C23C 16/403 428/332 |
| 2011/0024779 | A1 | * | 2/2011 | Nakamura | B82Y 20/00 257/98 |
| 2011/0070456 | A1 |   | 3/2011 | Philippens et al. | |
| 2011/0196109 | A1 |   | 8/2011 | Cho et al. | |
| 2012/0098421 | A1 | * | 4/2012 | Thompson | B32B 27/08 313/512 |
| 2013/0029148 | A1 | * | 1/2013 | Carney | C08J 5/18 428/355 EP |

(Continued)

FOREIGN PATENT DOCUMENTS

| CN | 1348609 A | 5/2002 |
| CN | 101885732 A | 11/2010 |

(Continued)

OTHER PUBLICATIONS

Bathelt, R., D. Buchhauser, C. GÃarditz, R. Paetzold, and P. Wellmann. "Light Extraction from OLEDs for Lighting Applications through Light Scattering." Organic Electronics 8.4 (2007): 293-99.*
Saxena, Kanchan, V.k. Jain, and Dalip Singh Mehta. "A Review on the Light Extraction Techniques in Organic Electroluminescent Devices." Optical Materials 32.1 (2009): 221-33Rand, B.P. External vs. Internal OLED outcoupling strategies, DOE SSL R&D Workshop, Feb. 4, 2016 Raleigh N.C.*
Rand, B.P. External vs. Internal OLED outcoupling strategies, DOE SSL R&D Workshop, Feb. 4, 2016 Raleigh N.C.*
Machine Translation of JP 2009 076452.*
Su, Hung-Wen, and Wen-Chang Chen. "High Refractive Index Polyimide Nanocrystalline-titania Hybrid Optical Materials." Journal of Materials Chemistry 18.10 (2008): 1139.*
1095-78-9 2,2-Bis(4-aminophenyl)hexafluoropropane, downloaded from URL<http://www.chemnet.com/cas/en/1095-78-9/2,2-Bis(4-aminophenyl)hexafluoropropane.html> on Apr. 13, 2017.*

(Continued)

*Primary Examiner* — Joseph Schoenholtz
(74) *Attorney, Agent, or Firm* — Dentons US LLP

(57) ABSTRACT

Provided are a substrate for an OED and a use thereof. The substrate may be applied to manufacture a flexible device exhibiting a suitable haze to have an excellent physical property such as transmittance, and also have excellent physical properties such as surface smoothness and refractive index when needed.

14 Claims, No Drawings

(56) References Cited

U.S. PATENT DOCUMENTS

| | | | |
|---|---|---|---|
| 2013/0161864 A1* | 6/2013 | Liang | B05D 5/00 |
| | | | 264/241 |
| 2013/0287936 A1 | 10/2013 | Jang et al. | |
| 2014/0031499 A1* | 1/2014 | Cho | C08G 73/1067 |
| | | | 525/431 |
| 2014/0197387 A1* | 7/2014 | Miyao | C08J 5/005 |
| | | | 257/40 |
| 2014/0316074 A1* | 10/2014 | Park | C08G 73/1067 |
| | | | 525/435 |
| 2014/0319488 A1* | 10/2014 | Lee | H01L 51/5253 |
| | | | 257/40 |
| 2015/0018484 A1* | 1/2015 | Lin | C08J 5/18 |
| | | | 524/600 |
| 2015/0148517 A1* | 5/2015 | Androsov | C07C 237/40 |
| | | | 528/331 |
| 2015/0225523 A1* | 8/2015 | Suenaga | C08G 73/1039 |
| | | | 428/435 |
| 2016/0060404 A1* | 3/2016 | Lin | B32B 27/281 |
| | | | 156/230 |
| 2016/0168328 A1* | 6/2016 | Takiue | C09D 179/08 |
| | | | 525/436 |
| 2016/0194542 A1* | 7/2016 | Sekine | C08G 73/1064 |
| | | | 361/688 |

FOREIGN PATENT DOCUMENTS

| | | |
|---|---|---|
| CN | 101971387 A | 2/2011 |
| CN | 102362369 A | 2/2012 |
| CN | 103155194 A | 6/2013 |
| CN | 103240936 A | 8/2013 |
| EP | 1548856 A2 | 6/2005 |
| EP | 2203030 A1 | 6/2010 |
| JP | 07207023 A * | 8/1995 |
| JP | 2001-126861 A | 5/2001 |
| JP | 2005-038661 A | 2/2005 |
| JP | 2007-335253 A | 12/2007 |
| JP | 2009-76452 A | 4/2009 |
| JP | 2009076452 A * | 4/2009 |
| JP | 2012-051995 A | 3/2012 |
| JP | 2012-107178 A | 6/2012 |
| JP | 2012-521623 A | 9/2012 |
| JP | 2013-76026 A | 4/2013 |
| JP | 2013-077585 A | 4/2013 |
| JP | 2013-082774 A | 5/2013 |
| JP | 2013-163304 A | 8/2013 |
| KR | 10-2012-0024510 A | 3/2012 |
| KR | 101248019 B1 * | 3/2013 |
| NO | 2011/033751 A | 3/2011 |
| WO | 2012/014740 A1 | 2/2012 |

OTHER PUBLICATIONS 341-58-2 2,2'-bis(trifluoromethyl)benzidine downloaded from URL<http://www.chemnet.com/cas/en/341-58-2/TFMB.html> on Apr. 13, 2017.*

3 Toluidine downloaded from URL<http://www.chemspider.com/Chemical-Structure.13860692.html>> on Apr. 13, 2017.*

Toluidines downloaded from URL<http://www.chemicalland21.com/industrialchem/organic/TOLUIDINES.htm> on Apr. 13, 2017.*

Bathelt, R., D. Buchhauser, C. Gärditz, R. Paetzold, and P. Wellmann. "Light Extraction from OLEDs for Lighting Applications through Light Scattering." Organic Electronics 8.4 (2007): 293-99.*

Ober, C. "Substrates", Mar. 28, 2013 downloaded from URL<http://people.ccmr.cornell.edu/~cober/MSE5420/page2/files/iNEMISubstrateFlex0808.pdf> on Jan. 4, 2018.*

Bhandari, A. "Low-Cost Integrated Substrate for OLED Lighting", PPG Integrated OLED Technologies, DOE SSL R & D Conference, Jan. 30, 2013.*

Ree, M., et. al. "Anisotropic Properties of High Temperature Polyimide Thin Films: Dielectric and Thermal-Expansion Behaviors", J. Appl. Phys. 72 (5) Sep. 1, 1992.*

Machine Translation of KR 101248019.*

R., D. Buchhauser, C. Gärditz, R. Paetzold, and P. Wellmann. "Light Extraction from OLEDs for Lighting Applications through Light Scattering." Organic Electronics 8.4 (2007): 293-99.*

Sachdev, Krishna G., et al. "Low TCE Polyimides from Polyamic Acid Blends and Copolymers: Preparation and Characterization Studies." MRS Proceedings, vol. 264, 1992, doi:10.1557/proc-264-91.*

Triani, et al.: "Atomic Layer Deposition of TiO2/Al2O3 Films for Optical Applications", XP055270341, SPIE—International Society for Optical Engineering, Proceedings, vol. 5870, Aug. 18, 2005, p. 587009-9.

* cited by examiner

SUBSTRATE FOR ORGANIC ELECTRONIC DEVICE

This application is a National Stage Entry of International Application No. PCT/KR2014/009224, filed Sep. 30, 2014, and claims the benefit of and priority to Korean Application No. 10-2013-0116194, filed Sep. 30, 2013, Korean Application No. 10-2014-0131921, filed Sep. 30, 2014, all of which are incorporated herein by reference in their entirety for all purposes as if fully set forth herein.

FIELD

The present application relates to a substrate for an organic electronic device (OED) and a use thereof.

BACKGROUND

Types of the OED include an organic light emitting device (OLED), an organic photovoltaic cell, an organic photo conductor (OPC), or an organic transistor. For example, a conventional OED sequentially includes a glass substrate, a transparent electrode layer, an organic layer including an emitting unit, and a reflective electrode layer.

In a structure called as a bottom emitting device, the transparent electrode layer may be formed as a transparent electrode layer, and the reflective electrode layer may be formed as a reflective electrode layer. In addition, in a structure called as a top emitting device, the transparent electrode layer may be formed as a reflective electrode layer, and the reflective electrode layer may be formed as a transparent electrode layer. From the electrode layer, electrons and holes are injected, and recombined in an emitting unit, thereby generating light. The light may be emitted to the substrate in the bottom emitting device, and emitted to the reflective electrode layer in the top emitting device.

In the light emitted from the organic layer, a part of the light incident at an interface of each layer at a critical angle or more is not emitted and trapped because of total internal reflection, thereby emitting only a very small amount of the light. Accordingly, for example, as disclosed in the patent document 1, there is an attempt to increase light extraction efficiency. However, light extraction technology known so far generally uses a rigid substrate such as a glass substrate, and thus is not effectively applied to a device using a flexible substrate having a different property from the glass substrate.

PRIOR ART DOCUMENT

Patent Document

PATENT DOCUMENT 1: Japanese Patent No. 3861758

DESCRIPTION

Object

The present application is directed to providing a substrate which may be applied to manufacture a flexible device having a suitable haze and excellent physical properties such as light extraction efficiency, and also have other excellent physical properties such as surface smoothness and refractive index when needed.

Solution

In one aspect, an illustrative substrate for an OED may include a polyimide film as a base film. The polyimide film may generate a haze by using a minimum amount of light scattering particles, or without using the light scattering particles. Accordingly, the polyimide may have an excellent smoothness compared to a general haze plastic film, and exhibit an excellent effect in the OED. Since a refractive index of the polyimide film can be freely adjusted according to necessity, a high refractive index which is difficult to be realized in a conventional plastic film can also be realized according to a purpose. When needed, the substrate may include a high refractive layer in addition to the base film.

Conventionally, the polyimide is prepared by preparing a polyamic acid through a condensation reaction of tetracarboxylic acid dianhydride and a diamine compound, and imidizing the amic acid. Accordingly, the polyimide base film of the present application may also include a condensation unit (that is, a polyamic acid unit) of the dianhydride and the diamine compound, or an imidization unit (that is, a polyimide unit) thereof.

In the present application, at least one of the above-described haze and refractive index may be adjusted using at least two of the units included in the polyimide base film. Accordingly, the polyimide base film may include a condensation unit of a first tetracarboxylic acid dianhydride and a first diamine compound or an imidization unit thereof as a first unit, and a condensation unit of a second tetracarboxylic acid dianhydride and a second diamine compound or an imidization unit thereof as a second unit.

In the base film, the first and second units may be present in one polymer or in different polymers. That is, the base film may include a copolymer including the first unit and the second unit, or a polymer including the first unit and a polymer including the second unit. In addition, each of the first and second units may be a chain included in a predetermined polymer, or a polymer.

The first and second units may have different physical properties to adjust at least one of the haze and the refractive index. For example, the first and second units may have different refractive indexes from each other. The term "refractive index" is, unless particularly defined otherwise, a refractive index measured with respect to light having a wavelength of 550 nm. For example, the absolute value of the difference in refractive index between the first and second units may be 0.01 or more. In another example, the absolute value of the difference in the refractive index may be approximately 0.02, 0.03, 0.04, 0.05 or 0.06 or more. The absolute value of the difference in refractive index may be approximately 0.2, 0.15, 0.1 or 0.08 or less. A method of adjusting the refractive indexes of the first unit and the second unit as described above is not particularly limited, and may be adjusted, for example, by selecting a component constituting each unit. For example, as will be described below, each of the dianhydride or the diamine compound for forming the unit may be selected from an aromatic, aliphatic or alicyclic dianhydride or a diamine compound. When an aromatic compound known to generally provide a high refractive index is selected, a unit having a relatively high refractive index may be formed.

In another example, the first and second units may have different polarities. For example, either one or both of the first and second units may include at least one polar functional group. In this case, the absolute value of the difference between a mole number of polar functional groups included in the first unit and a mole number of polar functional groups included in the second unit may be 2 or more. The absolute value of the difference in mole number may be, in another example, 10, 8, 6, or 4 or less. The polar functional group may be substituted by the above-described dianhydride or diamine compound. A type of the polar functional group to be applied may be, but is not particularly limited to, a halogen atom such as fluorine or chlorine, a haloalkyl group substituted by a halogen such as fluorine or chlorine, a cyano group, a nitro group, a hydroxyl group, an alkoxy group, a cyanate group or a thiocyanate group, and in terms of convenience of the application, a halogen atom or a haloalkyl group. Here, the haloalkyl group or an alkoxy group may be a haloalkyl group or alkoxy group having 1 to 20, 1 to 16, 1 to 12, 1 to 8 or 1 to 4 carbon atoms. Various dianhydrides or diamine compounds substituted with the above-described polar functional group may be known, or synthesized by conventional methods.

A haze of the polyimide base film may be uniformly adjusted using a difference in refractive index or polarity between the first and second units. A mixture of different types of polyimide having different refractive index or polarity may form an opaque emulsion, and it is considered that opacity of the emulsion is transferred to the film. Accordingly, as the difference in the refractive index or polarity of the component for forming the emulsion is adjusted, the haze of the polyimide film may be adjusted. In addition, as a ratio of the unit having a high refractive index is adjusted in this process, the refractive index of the entire film may also be easily adjusted. As the haze is given by a polymer unit itself, not by a method of giving a haze using conventional scattering particles, the polymer may have an excellent surface smoothness as well as the uniform haze.

Ratios of the first and second units in the base film may be adjusted in consideration of desired refractive index and haze without particular limitation. For example, the base film may include approximately 3 to 100, 3 to 80, 3 to 60, 3 to 40, 3 to 20 or 3 to 15 parts by weight of the first unit with respect to 100 parts by weight of the second unit, but the present application is not limited thereto.

A type of the dianhydride or diamine compound for forming the polyimide including the first and second units and a method of forming the unit using the same are not particularly limited. In the field relating to a polyimide, various dianhydrides or diamine compounds for synthesizing a polyimide are known, and a suitable type may be selected from the known components in consideration of desired refractive index or polarity.

For example, as an aliphatic, alicyclic or aromatic tetracarboxylic acid dianhydride which can be used as the dianhydride, butane tetracarboxylic acid dianhydride, pentane tetracarboxylic acid dianhydride, hexane tetracarboxylic acid dianhydride, cyclopentane tetracarboxylic acid dianhydride, bicyclopentane tetracarboxylic acid dianhydride, cyclopropanetetracarboxylic acid dianhydride, methylcyclohexanetetracarboxylic acid dianhydride, 3,3',4,4'-benzophenonetetracarboxylic acid dianhydride, 3,4,9,10-perylenetetracarboxylic acid dianhydride, 4,4'-sulfonyldiphthalic dianhydride, 3,3',4,4'-biphenyltetracarboxylic acid dianhydride, 1,2,5,6-naphthalenetetracarboxylic acid dianhydride, 2,3,6,7-naphthalenetetracarboxylic acid dianhydride, 1,4,5,8-naphthalenetetracarboxylic acid dianhydride, 2,3,5,6,-pyridine tetracarboxylic acid dianhydride, m-terphenyl-3,3', 4,4'-tetracarboxylic acid dianhydride, p-terphenyl-3,3',4,4'-tetracarboxylic acid dianhydride, 4,4'-oxydiphthalic dianhydride, 1,1,1,3,3,3-hexafluoro-2,2-bis[(2,3 or 3,4-dicarboxyphenoxy)phenylpropane dianhydride, 2,2-bis[4-(2, 3- or 3,4-dicarboxyphenoxy)phenyl]propane dianhydride, or 1,1,1,3,3,3-hexafluoro-2,2-bis[4-(2,3- or 4-dicarboxyphenoxy)phenyl]propane dianhydride may be used, as an aromatic, aliphatic or alicyclic diamine compound, an aromatic diamine such as p-phenylenediamine (PDA), m-phenylenediamine (m-PDA), 2,4,6-trimethyl-1,3-phenylenediamine, 2,3,5,6-tetramethyl-1,4-phenylenediamine, 4,4'-diaminodiphenylether, 3,4'-diaminodiphenylether, 3,3'-diaminodiphenylether, 4,4'-diaminodiphenylsulfide, 4,4'-diaminodiphenylmethane, 3,4'-diaminodiphenylmethane, 3,3'-diaminodiphenylmethane, 4,4'-methylene-bis(2-methylaniline), 4,4'-methylene-bis(2,6-dimethylaniline), 4,4'-methylene-bis(2,6-diethylaniline), 4,4'-methylene-bis(2-isopropyl-6-methylaniline), 4,4'-methylene-bis(2,6-diisopropylaniline), 4,4'-diaminodiphenylsulfone, 3,3'-diaminodiphenylsulfone, benzidine, o-tolidine, m-tolidine, 3,3',5,5'-tetramethylbenzidine, 2,2'-bis(trifluoromethyl)benzidine, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 2,2-bis[4-(4-aminophenoxy)phenyl]propane, 2,2-bis[4-(3-aminophenoxy)phenyl]propane, 2,2-bis[4-(4-aminophenoxy)-phenyl]propane(6HMDA), 2,2'-bis(trifluoromethyl)-benzidine(2,2'-bis(trifluoromethyl) benzidine, TFMB), 3,3'-bis(trifluoromethyl)-4,4'-diaminobiphenyl(3,3'-TFDB), 4,4'-bis(3-aminophenoxy) diphenylsulfone (DBSDA), bis(3-aminophenyl)sulfone (3DDS), bis(4-aminophenyl)sulfone (4DDS), 1,3-bis(3-aminophenoxy)benzene (APB-133), 1,4-bis(4-aminophenoxy)benzene (APB-134), 2,2'-bis[3(3-aminophenoxy)phenyl]hexafluoropropane (3-BDAF), 2,2'-bis[4(4-aminophenoxy)phenyl]hexafluoropropane (4-BDAF), 2,2'-bis(3-aminophenyl)hexafluoropropane (3,3'-6F), 2,2'-bis(4-aminophenyl)hexafluoropropane (4,4'-6F) or 4,4'-oxydianiline (ODA); or an aliphatic diamine such as 1,6-hexanediamine, 1,4-cyclohexanediamine, 1,3-cyclohexanediamine, 1,4-bis(aminomethyl)cyclohexane, 1,3-bis(aminomethyl)cyclohexane, 4,4'-diaminodicyclohexylmethane, 4,4'-diamino-3,3'-dimethyldicyclohexylmethane, 4,4'-diamino-3,3'-dimethyldicyclohexylmethane, 1,2-bis-(2-aminoethoxy)ethane, bis(3-aminopropyl)ether, 1,4-bis(3-aminopropyl)piperazine, 3,9-bis(3-aminopropyl)-2,4, 8,10-tetraoxaspiro[5.5]-undecane, or 1,3-bis(3-aminopropyl)tetramethyldisiloxane may be used, but the present application is not limited thereto.

The base film may be a light-transmitting film. The term "light-transmitting film" may refer to a film having a transmittance to any one light in a visible region or light in the entire visible region of, for example, 50, 60, 70 or 80% or more.

The haze of the base film may be adjusted according to necessity, and may be adjusted within a range of, for example, 3 to 90%. The term "haze" used herein may be measured using a device such as a haze meter HM-150 according to ASTM D1003. Here, another lower limit of the haze may be, for example, approximately 5 or 10%. In addition, another upper limit of the haze may be, for example, approximately 85, 80, 75, 70, 65, 60, 55, 50, 45, 40, 35, or 30%. As described above, in the present application, a haze may be given through selection of a unit of the polymer of the base film, and thereby, the base film may not include scattering particles, or include a small amount of the scattering particles. The term "scattering particles" used herein may refer to particles having a different refractive index from a peripheral matrix and an average particle diameter to an extent that the incident light can be scattered according to a wavelength of the incident light. The base film of the present application may include the scattering particles at approximately 10, 8, 6, 4, 2 or 1 wt % or less with respect to a total weight of the base film, or may not substantially include the scattering particles.

The base film may have a coefficient of thermal expansion (CTE) of approximately 5 to 70 ppm/° C. Such a range may be advantageous to prevent a defect such as interlayer delamination occurring in the structure in which an organic material layer and an inorganic material layer are mixed.

The base film may have a glass transition temperature of approximately 200° C. or more. Such a glass transition temperature may be a glass transition temperature of the base film, or a glass transition temperature of the base film on which a buffer layer to be described below is formed. Such a range may be suitable for a high temperature process for deposition or patterning in a process of manufacturing an OED. The glass transition temperature may be, in another example, approximately 210, 220, 230, 240 or 250° C. or more. The upper limit of the glass transition temperature may be, but is not particularly limited to, for example, approximately 400, 350 or 300° C.

In the base film, a root mean square (RMS) may be adjusted within a range of approximately 0.1 to 5 nm. Such an RMS may be that for a surface of the base film, or that for a surface of a buffer layer to be described below of the base film. The range of the surface roughness may be advantageous to improve performance of a layer formed thereon. For example, when an inorganic material layer having a barrier property is formed on the base film, the inorganic material layer is formed on a surface having an RMS in the above range, a layer having an excellent water barrier property may be formed. The RMS may be, in another example, approximately 4, 3, 2.5 or 2 nm or less.

The base film may have a refractive index of approximately 1.5, 1.6, 1.7, 1.75 or 1.8 or more. A range of the refractive index of the base film in the OED may be advantageous to increase luminous efficiency of the device. The upper limit of the refractive index of the base film may be, but is not particularly limited to, for example, approximately 2.0. The high refractive index of the base film may be adjusted through selection of a unit constituting the film as described above, or achieved by blending a suitable amount of a component having a high refractive index when needed.

A thickness of the base film may be selected in a suitable range in consideration of, not particularly limited to, desired performance, for example, flexibility, light extraction efficiency or a barrier property. For example, the base film may have a thickness of approximately 10 to 50 μm or 20 to 30 μm.

When needed, the substrate may further include a high refractive layer formed on the base film. The term "high refractive layer" used herein may refer to a layer having a refractive index for light having a wavelength of 550 nm of 1.7, 1.8, 1.85 or 1.9 or more. The upper limit of the refractive index of the high refractive layer may be, for example, approximately 2.0. As the high refractive layer is formed on the base film as described above, desired performance, for example, high extraction efficiency may be improved.

The high refractive layer may include high refractive particles, for example, with a binder. For example, the high refractive layer may be formed using a composition formed by mixing high refractive particles with the binder. Here, as the binder, a known material may be used without particular limitation. As the binder, for example, various organic binders, inorganic binders or organic/inorganic binders known in the art may be used. In consideration of a lifespan of the device or excellent resistance to a high temperature process, a photo process or an etching process performed in the manufacturing process, an organic binder, an inorganic binder or an organic/inorganic binder having excellent thermal resistance and chemical resistance may be selected. The binder may have a refractive index of, for example, approximately 1.4, 1.45, 1.5, 1.6, 1.65, or 1.7 or more. The upper limit of the refractive index of the binder may be selected in the range satisfying a refractive index of the high refractive layer in consideration of the refractive index of particles blended together. As the binder, for example, a heat or photocurable monomeric, oligomeric or polymeric organic material containing polyimide, polyamic acid, a caldo resin having a fluorene ring, urethane, epoxide, polyester or acrylate or an inorganic material or organic/inorganic combination material such as silicon oxide, silicon nitride, silicon oxynitride, an epoxy resin or a polysiloxane may be used.

The high refractive layer may further include high refractive particles. The term "high refractive particles" used herein may be, for example, particles having a refractive index of 1.8, 2.0, 2.2, 2.5, 2.6 or 2.7 or more. The upper limit of the refractive index of the high refractive particles may be selected in a range that can satisfy the refractive index of the high refractive layer in consideration of the refractive index of the binder blended together. The high refractive particles may have an average particle diameter of, for example, approximately 1 to 100, 10 to 90, 10 to 80, 10 to 70, 10 to 60, 1 to 50 or 10 to 45 nm. The high refractive particles may be, for example, alumina, alumino silicate, titanium oxide or zirconium oxide. As the high refractive particles, for example, rutile-type titanium oxide particles having a refractive index of 2.5 or more. The rutile-type titanium oxide may have a higher refractive index than other particles, and thus a desired refractive index can be adjusted in a relatively a small ratio. A ratio of the high refractive particles in the high refractive layer may be adjusted in a range capable of ensuring the above-described refractive index of the high refractive layer.

An inorganic material layer may be present on the base film, and in some cases, the inorganic material layer may serve as the high refractive layer. The term "inorganic material layer" used herein may be a layer including 50% or more or 60% of an inorganic material based on a weight. The inorganic material layer may only include an inorganic material, or include another component such as an organic material when including an inorganic material in the range.

The inorganic material layer may be, for example, a barrier layer. The term "barrier layer" used herein may be layer capable of preventing, inhibiting, or reducing the permeation of an external factor, for example, water or vapor, which can have a bad influence on the performance of the device such as an organic layer. For example, the barrier layer may have a water vapor transmission rate (WVTR) of $10^{-4}$ g/m$^2$/day or less. In the specification, the WVTR may be a value measured using a measurer (for example, PERMATRAN-W3/31, MOCON, Inc.) at 40° C. and a relative humidity of 90%.

The barrier layer may be formed of any one of the materials known to reduce, prevent, or inhibit the permeation of the external factors such as water and oxygen. The material may be a material known as a metal such as In, Sn, Pb, Au, Cu, Ag, Al, Ti, or Ni; a metal oxide such as TiO, $TiO_2$, $Ti_3O_3$, $Al_2O_3$, MgO, SiO, $SiO_2$, GeO, NiO, CaO, BaO, $Fe_2O_3$, Y2O3, $ZrO_2$, $Nb_2O_3$, or $CeO_2$; a metal nitride such as SiN; a metal oxynitride such as SiON; a metal fluoride such as $MgF_2$, LiF, $AlF_3$, or $CaF_2$; an absorbing material having an absorbance of 1% or more or a water-proof material having an absorption coefficient of 0.1% or less.

For example, the inorganic material layer may have a low degree of crystallization, or substantially have non-crystallinity. When formed by a general deposition method, the inorganic material layer has high probability of crystallization due to a property of the material, and thus is not easy to satisfy the above-described degree of crystallization. However, the inorganic material layer satisfying the above-described degree of crystallization by employing any one of a method of forming an inorganic layer using an oxide layer such as a metal oxide, a method of repeatedly forming a thin layer, a method of adjusting that each sub layer is formed of a different material during the repeatedly forming the thin layers, and a method of forming each sub layer using a different material, however, all of the sub layers being formed as oxide layers such as metal oxide layers.

It is suitable that the inorganic material layer may have a small difference in refractive index from the base film. In this case, particularly, it can contribute to formation of a substrate having excellent light extraction efficiency. For example, the absolute value of the difference in refractive index between the inorganic material layer and the base film may be approximately 1, 0.7, 0.5, or 0.3 or less. Accordingly, when the base film has a high refractive index as described above, the inorganic material layer may also have a refractive index at the same level. For example, the refractive index of the barrier layer may be approximately 1.5, 1.6, 1.7, or 1.75 or more. When the OED to which the substrate of the present application is applied is an OLED, the range of the refractive index of the base film may be advantageous to increase the luminous efficiency of the device. The upper limit of the refractive index of the inorganic material layer may be, for example, but is not particularly limited to, approximately 2.0.

A thickness of the inorganic material layer may be determined according to an effect caused by a desired use, and in one example, the range of the thickness may be, but is not particularly limited to, approximately 10 to 100, 1 to 90, 10 to 80, 1 to 70, 10 to 60, 10 to 50, or 20 to 50 nm.

While the inorganic material layer may have a monolayer or multilayer structure, it may be required to have a multilayer structure to satisfy the above-described degree of crystallization. The multilayer structure may include a structure in which the same type or different types of inorganic material layers are stacked. The formation of the inorganic material layer in a multilayer structure may contribute to the formation of an inorganic material layer having the above-described interface cohesive property and having the above-described degree of crystallization. In addition, the formation of the inorganic material layer in a multilayer structure may contribute to the formation of an inorganic material layer having the above-described refractive index.

The inorganic material having a multilayer structure may include at least a stack structure of a first sub layer and a second sub layer. In consideration of the interface cohesive property, the degree of crystallization, the barrier property or the refractive index required by the inorganic material layer, thicknesses of the first and second sub layers may be adjusted. For example, the thicknesses of the first and second sub layers may all be adjusted in a range of 7, 6, 5, 4, 3 or 2 nm or less. The lower limit of the thickness of the sub layer is not particularly limited. As the thickness of the sub layer is smaller, the contribution to the adjustment of the interface cohesive property, the degree of crystallization, the barrier property and the refractive index may be increased, and when the thickness of the sub layer is smaller, a required number of processes may be increased to reach a desired thickness. Accordingly, the lower limit of the thickness of the sub layer may be determined in a suitable range according to a desired thickness, etc., and may be adjusted to approximately 0.1 nm or more.

In consideration of the interface cohesive property, the degree of crystallization, the barrier property and the refractive index, the thicknesses of all sub layers included in the inorganic material layer having a multilayer structure may be adjusted in the above range. In this case, the inorganic material layer may not include a sub layer having a thickness of more than 10, 9, 8, 7, 6 or 5 nm.

The number of the sub layers included in the inorganic material layer is not limited. It may be adjusted according to the thickness of the sub layer and the thickness of the desired inorganic material layer. In one example, the inorganic material layer may include 2 to 50 sub layers. In this range, 4, 6, 8 or 10 or more sub layers may be included. In addition, in this range, 45, 40, 35, 30, 25, 20 or 15 or less sub layers may be included. When the inorganic material layer includes 3 or more sub layers, all of the sub layers may be the first or second sub layers, and in addition, a third sub layer or a higher sub layer may be included.

The sub layer may be formed of one of various materials, and may be formed of an oxide, a nitride or an oxynitride of various metals or non-metals to contribute to the interface cohesive property, the degree of crystallization, the barrier property and the refractive index. Accordingly, the first and second sub layers may be oxide layers, nitride layers or oxynitride layers. When needed, all of the sub layers included in the inorganic material layer may be formed of the oxide. A type of the oxide capable of being used in this case may be suitably selected from an oxide capable of forming the above-described barrier layer without particular limitation. Among the sub layers, sub layers in contact with each other may contribute to the interface cohesive property, the degree of crystallization, the barrier property and the refractive index as long as the sub layers are formed of different materials. Accordingly, when the first and second sub layers are in contact with each other, the different materials may be, for example, different oxides, nitrides or oxynitrides. Even though the inorganic material layer includes a third sub layer, a fourth sub layer or a higher sub layer as described above, it is advantageous that the sub layers in contact with each other may be formed of a different material, for example, a different oxide.

The first sub layer may have a first refractive index, and the second sub layer may have a second refractive index different from the first refractive index. When such a layer is stacked, it is advantageous that the above-described effect may be ensured and the refractive index of the inorganic material layer may be adjusted in the above range. The absolute value of the difference between a first refractive index and a second refractive index may be, for example, 0.1 or more. The absolute value may be, in another example, 0.2, 0.3, 0.4, 0.5 or 0.6 or more. In addition, the absolute value may be, in another example, in a range of 2, 1.8, 1.6, 1.4 or 1.2 or less. The ranges of the first and second refractive indexes are not particularly limited, as long as they are in the above range, but for example, the refractive index of the first sub layer may be in a range of 1.4 to 1.9, and the refractive index of the second sub layer may be in a range of 2.0 to 2.6. The first and second sub layers may be metal oxide layers. For example, a suitable material of the first sub layer may be $Al_2O_3$, and a suitable material of the second sub layer may be $TiO_2$. As long as the above range of refractive index may be obtained, and a final stack structure may have a barrier property, various materials may be applied.

The inorganic material layer or each sub layer may be formed by a known method, but to ensure the interface cohesion, it is advantageous that the inorganic material layer or each sub layer is formed by atomic layer deposition (ALD). The ALD may include a process of alternately depositing a precursor such as an organic metal and a precursor such as water on a surface to be adhered, and in this process, monolayers of the precursors may be alternately formed and react with each other. When a predetermined functional group, for example, the above-described hydroxyl group, is included in the base film, a layer formed by the ALD may react with the functional group during the formation, thereby ensuring the desired interface cohesive property. Unless particularly defined otherwise, the term "ALD layer" used herein may refer to an inorganic material layer formed by the ALD.

A method of forming an inorganic material layer or a sub layer which can be applied, other than the ALD, may include physical vapor deposition (PVD) such as sputtering, pulsed laser deposition (PLD), electron beam evaporation, thermal evaporation, or laser molecular beam epitaxy (L-MBE), or a chemical vapor deposition (CVD) such as metal organic chemical vapor deposition (MOCVD), hydride vapor phase epitaxy (HVPE), initiated chemical vapor deposition (iCVD), or plasma enhanced chemical vapor deposition (PECVD). When needed, a suitable one of the above methods may be selected according to a material to be used, thereby maximizing performance of the inorganic material layer.

The substrate of the present application may include an additional layer. For example, the substrate of the present application may further include a buffer layer between the inorganic material layer and the base film to achieve an interface cohesive property between the inorganic material layer and the base film. However, the buffer layer is not a necessary component, and for example, as long as the interface cohesive property is achieved, the buffer layer may not be required.

The substrate of the present application may further include an electrode layer present on the inorganic material layer.

As an electrode layer, a hole injection or electron injection electrode layer conventionally used in the OED may be used. The electrode layer may be a transparent electrode layer, or a reflective electrode layer.

The hole injection electrode layer may be formed of, for example, a material having a relatively high work function, and when needed, may be formed of a transparent or reflective material. For example, the hole injection electrode layer may include a metal, an alloy, an electro conductive compound or a mixture of at least two thereof having a work function of approximately 4.0 eV or more. Such a material may be a metal such as gold, CuI, indium tin oxide (ITO), indium zinc oxide (IZO), zinc tin oxide (ZTO), aluminum- or indium-doped zinc oxide, magnesium indium oxide, nickel tungsten oxide, an oxide such as ZnO, $SnO_2$, or $In_2O_3$, a metal nitride such as gallium nitride, a metal selenide such as zinc selenide, or a metal sulfide such as zinc sulfide. A transparent hole injection electrode layer may also be formed of a stack of a metal thin film such as Au, Ag, or Cu and a high refractive transparent material such as ZnS, $TiO_2$, or ITO.

The hole injection electrode layer may be formed by an optional means such as deposition, sputtering, chemical deposition, or an electrochemical means. In addition, the electrode layer formed according to its use may be patterned through a known photolithography or a process using a shadow mask.

The electron injection electrode layer may be formed, for example, using a material having a relatively low work function, and may be formed using a suitable transparent or reflective material among the materials used to form the hole injection electrode layer, but the present application is not limited thereto. The electron injection electrode layer may also be formed by, for example, deposition or sputtering, or may be suitably patterned when needed.

The electrode layer may be formed to have a thickness of, for example, approximately 90 to 200, 90 to 180, or 90 to 150 nm.

In another aspect, the present application provides an OED. The OED may include the above-described substrate for an OED, and a device region having a first electrode layer, an organic material layer, and a second electrode layer, which are present on an inorganic material layer of the substrate. When the substrate for an OED includes the above-described electrode layer, the electrode layer may serve as the first electrode layer.

The illustrative OED may include the substrate including the base film and the inorganic material layer, a first electrode layer, an organic material layer, a second electrode layer, a second inorganic material layer, and a cover film, which are sequentially present in a top direction. The layers may be directly stacked without another layer between adjacent layers, or may be stacked by means of another layer.

The term "top direction" used herein refers to, unless particularly defined otherwise, a direction from the first electrode layer to the second electrode layer, and the term "bottom direction" used herein refers to a direction from the second electrode layer to the first electrode layer.

Hereinafter, in the specification, for convenience of the description, in the above structure, a region including all of the factors present under the first electrode layer (excluding the first electrode layer) is called as a substrate region, a region including the first electrode layer, the second electrode layer, and all of the factors present therebetween is referred to as a device region, and a region including all of the factors (excluding the second electrode layer) present on the second electrode layer is referred to as an upper region.

The substrate region may include an additional layer in addition to the above-described base film. As the layer additionally present in the substrate region, a carrier substrate, a barrier film, or an adhesive layer may be used.

As another layer capable of being included in the substrate region, a barrier film may be used. Compared to a rigid structure using a substrate having an excellent barrier property of the properties of the material such as a glass substrate, in a flexible structure, a base film having a relatively low barrier property may be applied, and therefore, an additional barrier film may be present, for example, under the base film to compensate the barrier property. As the barrier film, a film which can ensure a suitable barrier property and transmittance when needed may be used without particular limitation.

The barrier film may be adhered to the base film, for example, using an adhesive layer. The term "adhesive layer" used herein includes materials conventionally called as an adhesive, and layers formed using a material called as a pressure-sensitive adhesive and a material called as an adhesive. The material for forming the adhesive layer may be, but is not particularly limited to, for example, a known pressure-sensitive adhesive/adhesive material such as an acrylic polymer, a silicon polymer, a rubber-based polymer, an ethylene vinyl acetate (EVA) polymer, or an olefin polymer such as polyisobutylene (PIB).

A suitable water-proof material may be blended with the adhesive layer. Hereinafter, the term "adhesive layer blended with the water-proof material" used herein may be an adhesive layer having a barrier property. The term "water-proof material" used herein may be used as a component which can adsorb or remove water or vapor introduced from an external environment through a physical or chemical reaction. A specific type of the water-proof material which can be blended with the adhesive layer may be, but is not particularly limited to, one or a mixture of at least two of, for example, a metal oxide, an organic metal oxide, a metal salt, and phosphorus pentoxide ($P_2O_5$). Here, a specific example of the metal oxide may be, but is not limited to, lithium oxide ($Li_2O$), sodium oxide ($Na_2O$), barium oxide (BaO), calcium oxide (CaO), or magnesium oxide (MgO), and the metal salt may be, but is not limited to, a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), or nickel sulfate ($NiSO_4$); a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$), or magnesium iodide ($MgI_2$); or a metal chlorate such as barium perchlorate ($Ba(ClO_4)_2$) or magnesium perchlorate ($Mg(ClO_4)_2$).

Suitable scattering particles may be blended in the adhesive layer, and thus the adhesive layer may exhibit a suitable haze. When the adhesive layer exhibits a haze, light extraction efficiency may be improved. A type of the scattering particles which can be blended in the adhesive layer is not particularly limited, and a suitable type of the scattering particles included in the scattering layer may be selected in consideration of the refractive index of a resin for forming the adhesive layer.

As another layer which may be present in the substrate region, a carrier substrate which may be temporarily or permanently adhered under the base film may be used. Conventionally, as the carrier substrate, a rigid substrate such as a glass substrate may be applied.

The substrate region may be formed in various structures. For example, the substrate region may have a structure in which a first inorganic layer and a base film are sequentially formed in a bottom direction, a structure in which a buffer layer and/or a scattering layer are formed between the first inorganic layer and the base film, or a structure in which a carrier film or a barrier film is adhered under the base film by an adhesive layer when needed.

An organic material layer is present between the first and second electrode layers. The organic material layer may include at least one or two emitting units. In such a structure, light generated from the emitting unit may be emitted to a transparent electrode layer through reflection by a reflective electrode layer.

When at least two emitting units are present, for suitable emission, an intermediate electrode layer or charge-generating layer may be further present between the plurality of emitting units. Accordingly, the emitting units may be divided by the intermediate electrode layer or charge-generating layer (CGL) having a charge-generating characteristic.

A material constituting the emitting unit is not particularly limited. Fluorescent or phosphorescent organic materials having various emission center wavelengths are known in the art, and a suitable type of the known materials may be selected to form the emitting unit. The material for the emitting unit may be, but is not limited to, an Alq-based material such as tris(4-methyl-8-quinolinolate)aluminum (III) (Alg3), 4-MAlq3, or Gaq3; a cyclopentadiene derivative such as C-545T($C_{26}H_{26}N_2O_2S$), DSA-amine, TBSA, BTP, PAP-NPA, spiro-FPA, PhTDAOXD ($Ph_3Si$), or 1,2,3,4,5-pentaphenyl-1,3-cyclopentadiene (PPCP); 4,4'-bis(2,2'-diphenylvinyl)-1,1'-biphenyl (DPVBi), distyrylbenzene, or a derivative thereof; 4-(dicyanomethylene)-2-tert-butyl-6-(1,1,7,7,-tetramethyljulolidyl-9-enyl)-4H-pyran (DCJTB), DDP, AAAP, or NPAMLI; or a phosphorescent material such as Firpic, m-Firpic, N-Firpic, $bon_2Ir(acac)$, $(C_6)_2Ir(acac)$, $bt_2Ir(acac)$, $dp_2Ir(acac)$, $bzq_2Ir(acac)$, $bo_2Ir(acac)$, $F_2Ir(bpy)$, $F_2Ir(acac)$, $op_2Ir(acac)$, $ppy_2Ir(acac)$, $tpy_2Ir(acac)$, fac-tris[2-(4,5'-difluorophenyl)pyridine-C'2,N] iridium(III) (FIrppy), or bis(2-(2'-benzo[4,5-a]thienyl)pyridinato-N,C3') iridium(acetylactonate) ($Btp_2Ir(acac)$). The emitting layer may include the above material as a host, and a host-dopant system including perylene, distyrylbiphenyl, DPT, quinacridone, rubrene, BTX, ABTX, or DCJTB as a dopant.

The emitting unit may also be formed by employing a suitable one exhibiting an emitting characteristic selected from electron accepting organic compounds or electron donating organic compounds, which will be described below.

The organic material layer may be formed in various structures further including various other functional layers known in the art, as long as it includes the emitting unit. As a layer capable of being included in the organic material layer, an electron injection layer, a hole blocking layer, an electron transport layer, a hole transport layer, or a hole injection layer may be used.

The electron injection layer or electron transport layer may be formed using, for example, an electron accepting organic compound. Here, as the electron accepting organic compound, a known optional compound may be used without particular limitation. As such an organic compound, a polycyclic compound such as p-terphenyl or quaterphenyl or a derivative thereof; a polycyclic hydrocarbon compound such as naphthalene, tetracene, pyrene, coronene, chrysene, anthracene, diphenylanthracene, naphthacene or phenanthrene, or a derivative thereof; or a heterocyclic compound such as phenanthroline, bathophenanthroline, phenanthridine, acridine, quinoline, quinoxaline or phenazine, or a derivative thereof may be used. In addition, fluoroceine, perylene, phthaloperylene, naphthaloperylene, perynone, phthaloperynone, naphthaloperynone, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyrane, thiopyrane, polymethine, merocyanine, quinacridone, rubrene or a derivative thereof, a metal chelate complex compound disclosed in a patent publication such as Japanese Patent Laid-Open Application No. 1988-295695, Japanese Patent Laid-Open Application No. 1996-22557, Japanese Patent Laid-Open Application No. 1996-81472, Japanese Patent Laid-Open Application No. 1993-009470, or Japanese Patent Laid-Open Application No. 1993-017764, for example, a metal complex having at least one of metal chelated oxinoid compounds such as 8-quinolinolatos including tris(8-quinolinolato)aluminum, bis(8-quinolinolato)magnesium, bis[benzo(f)-8-quinolinolato]zinc, bis(2-methyl-8-quinolinolato)aluminum, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium, and derivatives thereof as a coordinator; an oxadiazole compound disclosed in a patent publication such as Japanese Patent Laid-Open Application No. 1993-202011, Japanese Patent Laid-Open Application No. 1995-179394, Japanese Patent Laid-Open Application No. 1995-278124, or Japanese Patent Laid-Open Application No. 1995-228579; a triazine compound disclosed in a patent publication such as Japanese Patent Laid-Open Application No. 1995-157473; a stilbene derivative disclosed in a patent publication such as Japanese Patent Laid-Open Application No. 1994-203963; a distyrylarylene derivative; a styryl derivative disclosed in a patent publication such as Japanese Patent Laid-Open Application No. 1994-132080 or Japanese Patent Laid-Open Application No. 1994-88072; a diolefin derivative disclosed in a patent publication such as Japanese Patent Laid-Open Application No. 1994-100857 or Japanese Patent Laid-Open Application No. 1994-207170; a fluorescent brightening agent such as a benzooxazole compound, a benzothiazole compound, or a benzoimidazole compound; a distyrylbenzene compound such as 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzyl, 1,4-bis(3-ethylstyryl) benzene, 1,4-bis(2-methylstyryl)-2-methylbenzene, or 1,4-bis(2-methylstyryl)-2-ethylbenzene; a distyrylpyrazine compound such as 2,5-bis(4-methylstyryl)pyrazine, 2,5-bis (4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine, or 2,5-bis[2-(1-pyrenyl)vinyl]pyrazine; a dimethylidine compound such as 1,4-phenylenedimethylidine, 4,4'-phenylenedimethylidine, 2,5-xylene dimethylidine, 2,6-naphthylenedimethylidine, 1,4-biphenylenedimethylidine, 1,4-para-terephenylene dimethylidine, 9,10-anthracenediyldimethylidine, or 4,4'-(2,2-di-ti-butylphenylvinyl)biphenyl or 4,4'-(2,2-diphenylvinyl) biphenyl, or a derivative thereof; a silanamine derivative disclosed in a patent publication such as Japanese Patent Laid-Open Application No. 1994-49079 or Japanese Patent Laid-Open Application No. 1994-293778; a multifunctional styryl compound disclosed in a patent publication such as Japanese Patent Laid-Open Application No. 1994-279322 or Japanese Patent Laid-Open Application No. 1994-279323; an oxadiazole derivative disclosed in a patent publication such as Japanese Patent Laid-Open Application No. 1994-107648 or Japanese Patent Laid-Open Application No. 1994-092947; an anthracene compound disclosed in a patent publication such as Japanese Patent Laid-Open Application No. 1994-206865; an oxinate derivative disclosed in a patent publication such as Japanese Patent Laid-Open Application No. 1994-145146; a tetraphenyl butadiene compound disclosed in a patent publication such as Japanese Patent Laid-Open Application No. 1992-96990; an organic trifunctional compound disclosed in a patent publication such as Japanese Patent Laid-Open Application No. 1991-296595; a coumarin derivative disclosed in a patent publication such as Japanese Patent Laid-Open Application No. 1990-191694; a perylene derivative disclosed in a patent publication such as Japanese Patent Laid-Open Application No. 1990-196885; a naphthalene derivative disclosed in a patent publication such as Japanese Patent Laid-Open Application No. 1990-255789; a phthaloperynone derivative disclosed in a patent publication such as Japanese Patent Laid-Open Application No. 1990-289676 or Japanese Patent Laid-Open Application No. 1990-88689; or a styryl amine derivative disclosed in a patent publication such as Japanese Patent Laid-Open Application No. 1990-250292 may be used as an electron accepting organic compound included in the low refractive layer.

In addition, here, the electron injection layer may be formed using, for example, a material such as LiF or CsF.

The hole blocking layer may be a layer capable of enhancing a lifespan and efficiency of the device by preventing approach of injected holes to an electron injection electrode layer through the emitting unit, and may be formed in a suitable part between the emitting layer and the electron injection electrode layer using a known material when needed.

The hole injection layer or hole transport layer may include, for example, an electron donating organic compound. As the electron donating organic compound, N,N', N'-tetraphenyl-4,4'-diaminophenyl, N,N'-diphenyl-N,N'-di(3-methylphenyl)-4,4'-diaminobiphenyl, 2,2-bis(4-di-p-tolylaminophenyl)propane, N,N,N',N'-tetra-p-tolyl-4,4'-diaminobiphenyl, bis(4-di-p-tolylaminophenyl) phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino) quadriphenyl, 4-N,N-diphenylamino-(2-diphenylvinyl) benzene, 3-methoxy-4'-N,N-diphenylaminostyrylbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri(p-tolyl)amine, 4-(di-p-tolylamino)-4'-[4-(di-p-tolylamino)styryl]stilbene, N,N,N',N'-tetraphenyl-4,4'-diaminobiphenyl N-phenylcarbazole, 4,4'-bis[N-(1-naphthyl)-N-phenyl-amino]biphenyl, 4,4"-bis[N-(1-naphthyl)-N-phenylamino]p-terphenyl, 4,4'-bis[N-(2-naphthyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenylphenylamino]biphenyl, 4,4"-bis[N-(1-anthryl)-N-phenylamino]-p-terphenyl, 4,4'-bis[N-(2-phenanthryl)-N-phenylamino]biphenyl, 4,4'-bis [N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tolylamino)naphthalene, 2,6-bis[di-(1-naphthyl)amino] naphthalene, 2,6-bis[N-(1-naphthyl)-N-(2-naphthyl)amino] naphthalene, 4,4"-bis[N,N-di(2-naphthyl)amino]terphenyl, 4,4'-bis{N-phenyl-N-[4-(1-naphthyl)phenyl] amino}biphenyl, 4,4'-bis[N-phenyl-N-(2-pyrenyl)amino]biphenyl, 2,6-bis[N,N-di-(2-naphthyl)amino]fluorene, or 4,4"-bis(N,N-di-p-tolylamino)terphenyl, or an aryl amine compound such as bis(N-1-naphthyl)(N-2-naphthyl)amine may be used, but the present application is not limited thereto.

The hole injection layer or hole transport layer may be formed by dispersing an organic compound in a polymer, or using a polymer derived from the organic compound. In addition, a π-conjugated polymer such as polyparaphenylenevinylene and a derivative thereof, a hole transport nonconjugated polymer such as poly(N-vinylcarbazole), or a σ-conjugated polymer of polysilane may also be used.

The hole injection layer may be formed using an electrically-conductive polymer such as a metal phthalocyanine such as copper phthalocyanine or a non-metal phthalocyanine, a carbon film, and polyaniline, or may be formed by reaction with a Lewis acid using the aryl amine compound as an oxidizing agent.

A particular structure of the organic material layer is not particularly limited. Various materials and methods for forming a hole or electron injection electrode layer and an organic layer, for example, an emitting unit, an electron injection or transport layer, or a hole injection or transport layer are known in the art, and all of the methods may be applied to manufacture the OED.

An upper region of the OED may include an inorganic material layer and a cover film, which are sequentially formed in a top direction. To discriminate the inorganic material layer from that of the substrate for an OED, the inorganic material layer included in the upper region may be referred to as a second inorganic material layer, and the inorganic material layer included in the substrate may be referred to as a first inorganic material layer.

The second inorganic material layer is present to prevent, inhibit, or reduce the permeation of external materials, thereby obtaining durability, and specific material and forming method may be similar to those described in the category of the first inorganic material layer. However, when the second inorganic material layer is designed to emit light to the substrate region, it is not necessary to form the second inorganic material layer to have a high refractive index, which is the same as that of the first inorganic material layer.

A cover film present on the second inorganic material layer may be a structure for protecting an OED, which is, for example, a known barrier film, metal sheet, or conductive film, or a stack structure of at least two thereof. The cover film in the upper region may be adhered to a top surface of the second inorganic material layer by an adhesive layer, for example, the above-described adhesive layer having a barrier property.

In still another aspect, the present application provides a use of the OED, for example, an OLED. The OLED may be effectively applied to a backlight of a liquid crystal display (LCD), lightings, sensors, a light source of a printer or copy machine, a light source for an automobile gauge, a signal light, a pilot lamp, a display device, a light source for a planar emitting device, a display, decorations, or other kinds of lights. In one example, the present application relates to a lighting device including the OLED. When the OLED is applied to the lighting device or for different uses, other components constituting the device or a method of constituting the device is not particularly limited, but all of optional materials or methods known in the related art may be employed as long as the OLED is used.

Effect

According to the present application, a substrate can be applied to manufacture a flexible device exhibiting a suitable haze to have an excellent physical property such as transmittance, and also have excellent physical properties such as surface smoothness and refractive index when needed.

DETAILED DESCRIPTION OF EMBODIMENTS

Hereinafter, illustrative embodiments of the present application will be described in detail with reference to examples according to the present application. However, the scope of the present application is not limited to the embodiments to be disclosed below.

Preparation Example 1. Manufacture of Polyimide Substrate (A)

A first polyamic acid solution (refractive index: approximately 1.625) was synthesized through a condensation reaction of 3,3',4,4'-biphenyltetracarboxylic dianhydride (BPDA) and p-phenylene diamine (PDA) in a reactor, and a second polyamic acid solution (refractive index: approximately 1.56) was synthesized through a condensation reaction of BPDA and 2,2'-bis(trifluoromethyl)benzidine (TFMB) in another reactor. A composition for forming a film was prepared by mixing the first polyamic acid solution with the second polyamic acid solution in a ratio of 5:95 (the first polyamic acid:the second polyamic acid) based on the weight of a solid content, and stirring the mixture for 16 hours or more using a stirrer. Subsequently, a polyimide substrate (A) was synthesized by spin-coating the composition for forming a film on a glass substrate having a thickness of approximately 20 μm, heating the resulting glass substrate in an oven at a rate of approximately 2° C./min, and maintaining the substrate at 80° C. for 15 minutes, at 150° C. for 30 minutes, at 220° C. for 30 minutes, and at 350° C. for 1 hour to perform imidization. A haze of the substrate (A) was analyzed at approximately 5% using a haze meter HM-150 according to ASTM D1003, and a transmittance was approximately 85%.

Preparation Example 2. Manufacture of Polyimide Substrate (B)

A polyimide substrate (B) was manufactured by the same method as described in Preparation Example 1, except that a composition for forming a film prepared by mixing a first polyamic acid solution (refractive index: approximately 1.56) prepared through a condensation reaction of BPDA and TFMB, and a second polyamic acid solution (refractive index: approximately 1.541) prepared through a condensation reaction of 2,2'-bis-(3,4-dicarboxyphenyl) hexafluoropropane dianhydride (FDA) and TFMB in a ratio of 5:95 (the first polyamic acid:the second polyamic acid) based on the weight of a solid content was used. A haze of the synthesized base film was detected at approximately 5.12% using a haze meter HM-150 according to ASTM D1003, and a transmittance was approximately 86.4%.

Preparation Example 3. Manufacture of Polyimide Substrate (C)

A polyimide substrate (C) was manufactured by the same method as described in Preparation Example 1, except that a composition for forming a film prepared by mixing a first polyamic acid solution (refractive index: approximately 1.56) prepared through a condensation reaction of BPDA and TFMB, and a second polyamic acid solution (refractive index: approximately 1.541) prepared through a condensation reaction of FDA and TFMB in a ratio of 10:90 (the first polyamic acid:the second polyamic acid) was used. A haze of the synthesized base film was detected at approximately 16.44% using a haze meter HM-150 according to ASTM D1003, and a transmittance was approximately 83.5%.

Preparation Example 4. Manufacture of Polyimide Substrate (D)

A polyimide substrate (D) was manufactured by the same method as described in Preparation Example 1, except that a composition for forming a film prepared by mixing a first polyamic acid solution (refractive index: approximately 1.625) prepared through a condensation reaction of BPDA and PDA, and a second polyamic acid solution (refractive index: approximately 1.56) prepared through a condensation reaction of BPDA and TFMB in a ratio of 10:90 (the first polyamic acid:the second polyamic acid), and adding a high refractive filler (rutile $TiO_2$, refractive index: approximately 2.8) having a particle diameter in a range not exhibiting a scattering ability was used. A haze of the synthesized base film was detected at approximately 9% using a haze meter HM-150 according to ASTM D1003, a transmittance was approximately 81%, and a refractive index was approximately 1.8.

Preparation Example 5. Manufacture of Polyimide Substrate (E)

A polyimide substrate (E) was manufactured by the same method as described in Preparation Example 1, except that a polyamic acid solution (refractive index: approximately 1.541) prepared through a condensation reaction of FDA and TFMB was used as a composition for forming a film. A haze of the synthesized base film was detected at approximately 1.2% using a haze meter HM-150 according to ASTM D1003, and a transmittance was approximately 92%.

Example 1

An OED was formed on the polyimide substrate (A) formed on the glass substrate, which was manufactured in Preparation Example 1. The OED was manufactured by forming a device region by sequentially forming a hole injection transparent electrode layer, hole transport layer, a first emitting unit having an emission wavelength within a range of approximately 380 to 500 nm, an n-type organic semiconductor layer, a p-type organic semiconductor layer, a second emitting unit having an emission wavelength within a range of approximately 500 to 700 nm, a hole blocking layer, an electron transport layer, an electron injection layer and an electron injection reflective electrode layer using known materials on the polyimide substrate (A), and encapsulating the device region with a suitable encapsulating material. The manufactured OED measured by a known method had quantum efficiency of approximately 35.4%.

Example 2

An OED was formed on the polyimide substrate (B) formed on the glass substrate manufactured in Preparation Example 2. First, a barrier layer was formed on the polyimide substrate (B). The barrier layer was formed to obtain a final refractive index of approximately 1.8 through ALD by alternately depositing an $Al_2O_3$ layer having a refractive index of approximately 1.6 to 1.8 in a single deposition and a $TiO_2$ layer having a refractive index of approximately 2.0 to 2.4 in a single deposition. The $Al_2O_3$ layer was formed by alternately adsorbing a trimethylaluminum layer as a precursor and a water ($H_2O$) layer through the known ALD at approximately 200° C., and the $TiO_2$ layer was also formed by alternately adsorbing a $TiCl_4$ layer as a precursor and a water ($H_2O$) layer through the known ALD at approximately 200° C. In this case, the barrier layer was formed to have a final thickness of approximately 40 nm by adjusting each of thicknesses of the $Al_2O_3$ layer and the $TiO_2$ layer to be in a range of approximately 2 to 5 nm. Subsequently, an OED was manufactured by forming a device region by sequentially forming a hole injection transparent electrode layer, hole transport layer, a first emitting unit having an emission wavelength within in a range of 380 to 500 nm, an n-type organic semiconductor layer, a p-type organic semiconductor layer, a second emitting unit having an emission wavelength within a range of approximately 500 to 700 nm, a hole block layer, an electron transport layer, an electron injection layer and an electron injection reflective electrode layer using known methods on the barrier layer, and encapsulating the device region with a suitable encapsulating material. The manufactured OED measured by a known method had quantum efficiency of approximately 41.6%.

Example 3

An OED was formed by the same method as described in Example 1, except that the polyimide substrate (C) manufactured in Preparation Example 3 was applied. The manufactured OED measured by a known method had quantum efficiency of approximately 41.6%.

Example 4

An OED was formed by the same method as described in Example 1, except that the polyimide substrate (D) manufactured in Preparation Example 4 was applied. The manufactured OED measured by a known method had quantum efficiency of approximately 42%.

Comparative Example 1

An OED was formed by the same method as described in Example 1, except that the polyimide substrate (F) manufactured in Preparation Example 5 was applied. The manufactured OED measured by a known method had quantum efficiency of approximately 31.9%.

What is claimed is:

1. A substrate for an organic electronic device (OED), comprising:
    a base film comprising an imidization product of a first polyamic acid having a condensation unit of a first tetracarboxylic acid dianhydride and a first diamine compound and a second polyamic acid having a condensation unit of a second tetracarboxylic acid dianhydride and a second diamine compound,
    wherein the first tetracarboxylic acid dianhydride and the second tetracarboxylic acid dianhydride are selected from 3,3',4,4'-biphenyltetracarboxylic acid dianhydride and 2,2'-bis-(3,4-dicarboxylphenyl) hexafluoropropane dianhydride,
    wherein the first diamine compound and the second diamine compound are selected from p-phenylene diamine and 2,2'-bis(trifluoromethyl)benzidine,
    wherein the weight ratio of the first polyamic acid to the second polyamic acid is from 5:95 to 10:90 based on a total solid content of the first and second polyamic acid present in a solution, and
    wherein an absolute value of the difference in the refractive index between the first polyamic acid and the second polyamic acid is between 0.019 to 0.065,
    with the proviso that the first tetracarboxylic acid dianhydride is the same as the second tetracarboxylic acid dianhydride or the first diamine compound is the same as the second diamine compound.

2. The substrate according to claim 1, wherein the base film has a refractive index for light having a wavelength of 550 nm of 1.7 or more.

3. The substrate according to claim 1, wherein the base film has a root mean square (RMS) roughness of 5 nm or less.

4. The substrate according to claim 1, wherein a ratio of scattering particles in the base film is 10 wt % or less.

5. The substrate according to claim 1, further comprising:
    a high refractive layer formed on a surface of the base film and having a refractive index for light having a wavelength of 550 nm of 1.7 or more.

6. The substrate according to claim 5, wherein the high refractive layer is an inorganic material layer.

7. The substrate according to claim 6, wherein the inorganic material layer includes a stack structure of a first sub layer and a second sub layer.

8. The substrate according to claim 7, wherein each of the first sub layer and the second sub layer has a thickness of 7 nm or less.

9. The substrate according to claim 7, wherein the first sub layer has a refractive index of 1.4 to 1.9, and the second sub layer has a refractive index of 2.0 to 2.6.

10. An organic electronic device (OED), comprising:
the substrate for an OED of claim 1; and
a device region having a first electrode layer, an organic material layer, and a second electrode layer, which are present on an inorganic material layer of the substrate.

11. A light source for a display, comprising:
the OED of claim 10.

12. A lighting device, comprising:
the OED of claim 10.

13. An apparatus comprising:
a flexible non-glass substrate configured to accommodate organic light emitting elements; and
a base film, on the substrate, which comprises an imidization product of a first polyamic acid having a condensation unit of a first tetracarboxylic acid dianhydride and a first diamine compound and a second polyamic acid having a condensation unit of a second tetracarboxylic acid dianhydride and a second diamine compound,
wherein the base film does not include scattering particles, and
wherein the first tetracarboxylic acid dianhydride and the second tetracarboxylic acid dianhydride are selected from 3,3',4,4'-biphenyltetracarboxylic acid dianhydride and 2,2'-bis-(3,4-dicarboxylphenyl) hexafluoropropane dianhydride,
wherein the first diamine compound and the second diamine compound are selected from p-phenylene diamine and 2,2'-bis(trifluoromethyl)benzidine, and
wherein the weight ratio of the first polyamic acid to the second polyamic acid is from 5:95 to 10:90 based on a total solid content of the first and second polyamic acid present in a solution,
with the proviso that at least the first tetracarboxylic acid dianhydride is the same as the second tetracarboxylic acid dianhydride or the first diamine compound is the same as the second diamine compound.

14. The apparatus of claim 13, wherein the base film has a glass transition temperature of 200° C. or more, a coefficient of thermal expansion (CTE) of 5 to 70 ppm/° C.

* * * * *